US006320449B1

(12) United States Patent
Capici et al.

(10) Patent No.: US 6,320,449 B1
(45) Date of Patent: Nov. 20, 2001

(54) DRIVER CIRCUIT FOR P-CHANNEL MOS SWITCHES

(75) Inventors: Salvatore Vincenzo Capici, Barrafranca; Filippo Marino, Tremestieri Etneo, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/692,133

(22) Filed: Oct. 19, 2000

(30) Foreign Application Priority Data

Oct. 22, 1999 (EP) .................................................. 99830666

(51) Int. Cl.[7] .............................................. H03K 17/687
(52) U.S. Cl. ........................................... 327/435; 323/284
(58) Field of Search .............................. 307/131; 323/282, 323/284, 289; 327/108, 365, 419, 109, 427, 434, 435

(56) References Cited

U.S. PATENT DOCUMENTS

| 4,853,563 | 8/1989 | Hill et al. . | |
| 4,859,927 | 8/1989 | Meijer | 323/284 |
| 4,877,982 | 10/1989 | Walker . | |
| 5,426,334 | 6/1995 | Skovmand | 327/427 |
| 5,883,505 | * 3/1999 | Magazzo et al. | 323/282 |
| 6,127,746 | * 10/2000 | Clemente | 307/131 |

FOREIGN PATENT DOCUMENTS

| 0608667 | 8/1994 | (EP) . |
| 0620646 | 10/1994 | (EP) . |

* cited by examiner

Primary Examiner—Shawn Riley
(74) Attorney, Agent, or Firm—Theodore E. Galanthay (57) ABSTRACT

The invention relates to a driver circuit for P-channel MOS switches including a power transistor having a control terminal and first and second conduction terminals, a controlled current generator connected to the control terminal for turning on the power transistor, a control circuit for controlling the turning on of the current generator, and a protection circuit coupled to the control terminal. The driver circuit may also include a second current generator connected to the control terminal of the power transistor which is in turn driven by the control circuit to control the transistor turn-off. Advantageously, the control circuit may also receive a control signal from the protection circuit at the end of the latter's action.

22 Claims, 6 Drawing Sheets

DRIVER CIRCUIT FOR P-CHANNEL MOS SWITCHES

FIELD OF THE INVENTION

The present invention relates to a driver circuit for a power switch incorporated into a switching voltage regulator.

BACKGROUND OF THE INVENTION

The invention relates to the development of two discrete devices constructed with BCDV technology, that is, a step-down switching voltage regulator and a current loop for a battery charger. Reference will be made to this field of application in the ensuing description for convenience of explanation. Switching voltage regulators are extensively employed in many applications because of their effectiveness and accuracy. The basic components of these regulators include a power switch, a loop-back diode, an LC output filter, and an optional current sensor for the battery charger.

To compete favorably, new generation regulators exhibit ever higher switching frequencies so that smaller external components can be used, both for economy of circuit area and of cost. In particular, regulators of this type preferably have the smallest possible number of external components. An increased frequency results in the regulator efficiency being limited mainly by the commutation losses of the power switch. Accordingly, one critical design aspect of such regulators concerns the driver circuit portion of the power switch, since commutation losses are dependent on that portion.

Commercially available regulators typically use an N-channel MOS transistor for a power switch because of the simple way in which these switches can be driven. However, to ensure adequate overdrive for the driver, a MOS power switch requires a higher drive voltage than the supply voltage for the device. A boosted voltage may be provided basically in one of two ways, namely by using a charge pump or by using a bootstrap capacitor. Yet, both of these solutions have drawbacks. In particular, the former requires substantial silicon area for its implementation in order for the charge pump to deliver the large currents needed to drive the power switch. In addition, one or more external capacitors are usually required. The second solution additionally requires an external component, i.e., a bootstrap capacitor, and circuitry to monitor the charging of the component to ensure full operability of the system in all running conditions. Furthermore, both solutions involve increased manufacturing costs for the switching regulator.

In an attempt to overcome these drawbacks and to lower manufacturing costs, P-channel MOS transistors have been used as power switches in late generation regulators. Unlike N-channel switches, these switches require no boost drive voltage and, therefore, no additional external components for the drive circuitry. A driver circuit adapted for these types of PMOS switches preferably exhibits the following features: ensuring fast turn-on/off edges, but without straining the loop-back diode and the switch itself; minimizing electromagnetic noise; preventing false operation of any current limiters active when turning on; and optimizing the regulator efficiency and exhibiting low static consumption.

In the prior art, the above features have been optimized for driving switches of the NMOS type. For example, U.S. Pat. No. 5,883,505, which is assigned to the present Assignee, discloses a driver circuit for an NMOS switch which can manage a loop-back diode in a smart style with good resultant drive. For sake of completeness, it should also be noted that the application of a higher drive voltage than a predetermined safe threshold across the gate and source terminals of the PMOS transistor should be avoided as the switch is turned on.

This specific problem has been the subject of extensive research and implementations directed in essentially three different ways. In a first of such attempts to address the problem, external switches are used which can withstand a drive voltage between their gate and source that is the same as the supply voltage to the device. In a second of such attempts, the maximum supply voltage (VALmax) is limited to a value lower than or equal to the maximum Vgsmax that the PMOS transistor can withstand without deterioration of its performance. In the third of such attempts, protection circuits are used incidental on the maximum supply voltage VALmax and still exceeding the gate-source voltage drop that the transistor can withstand.

Figure 1A:
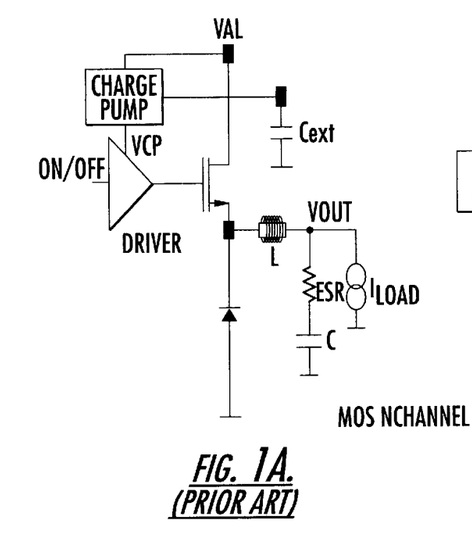
FIGS. 1A and 1B are respective schematic diagrams of conventional driver circuits for a power transistor of the N-channel MOS type according to the prior art.
Figure 1B:
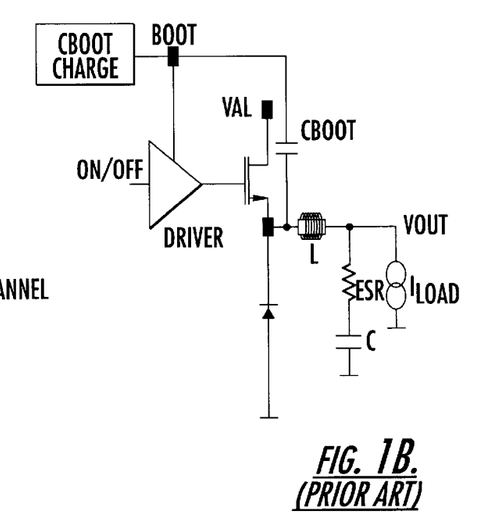
Figure 2:
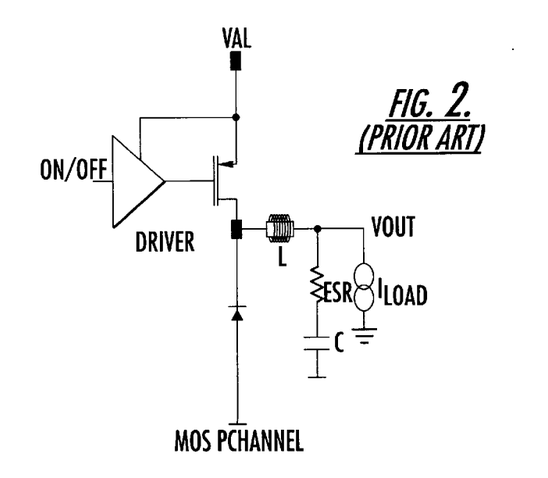
FIG. 2 is a schematic diagram an embodiment of a conventional driver circuit for a P-channel MOS transistor according to the prior art.
Figure 3:
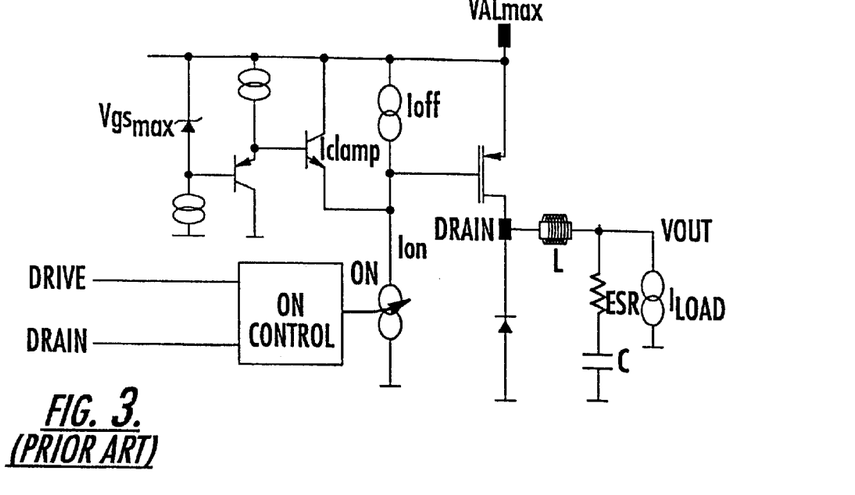
FIG. 3 a more detailed schematic diagram of a conventional driver circuit for a P-channel MOS transistor according to the prior art.

An electric diagram of a conventional switching regulator which incorporates a PMOS power transistor equipped with a driver circuit including a protection circuit is shown in FIG. 3. The operation of the protection circuit causes very high consumption that markedly decreases the regulator efficiency. For example, in the case shown in FIG. 4, different current signals appearing in a conventional voltage regulator with a PMOS switch are plotted vs. time. Upon the leading edge of the turn-on signal DRIVE, three other signals ON1, ON2 and ON3 of predetermined duration are activated. These signals enable the power transistor to be turned on at a fast rate, while also overcoming a problem of recovery time with the loop-back diode. More particularly, the signal ON1 sets the current value I1, which makes the power transistor conductive. The signal ON2 further charges the gate of the power transistor with a current I2 over a time interval T2 during the reversal period of the loop-back diode.

Figure 4:
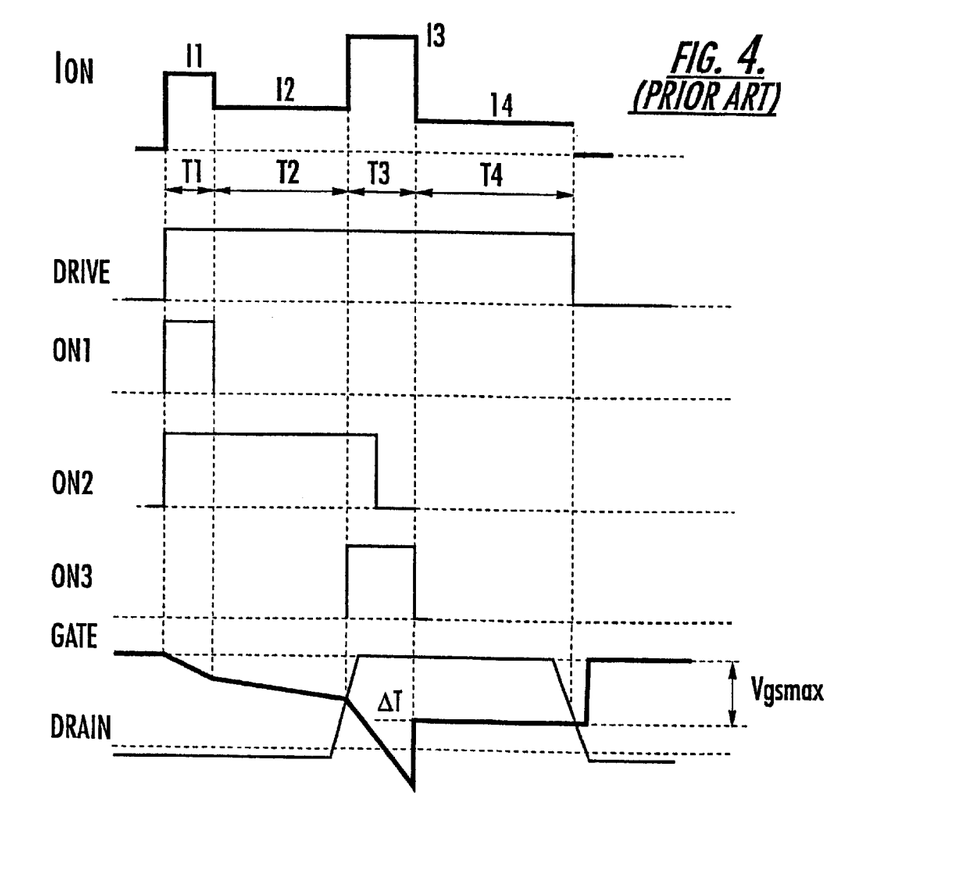
FIG. 4 is a graph vs. time of a series of current signal waveforms appearing in the prior art circuit of FIG. 3.

Upon the leading edge of the signal DRAIN, the signal ON3 also becomes activated to bring the current on the gate terminal of the power transistor to a value I3 to quicken the transistor turn-on. Turning off presents no special problems, since a desired rate of turn-off can be simply achieved by suitable selection of a magnitude for a current Ioff. At the end of the turn-on transient, the current being delivered to the gate terminal of the power transistor should be larger than the current Ioff and the current supplied to the protection circuit. Designating T4 the turn-on time interval, it is I4=ION>Ioff+Iclamp. This current is on the order of a few tens of mA and represents a substantial consumption. Reducing this consumption by limiting the drive currents is not feasible because the on/off transients would then be slowed and commutation losses increased.

Furthermore, during the time interval T3 (to be selected at the designing stage, and being subject to process spread and power supply variability), the power transistor gate is pulled down quite rapidly (T3 being on the order of a few tens of ns). The protection circuit will have a trigger time ΔT when the gate keeps dropping to values well beyond the threshold Vgsmax. This has two drawbacks. First, such behavior may result in short term reliability problems because the power transistor gate is subjected to a higher voltage than is acceptable during the periods ΔT. Secondly, to ensure a fast recovery, the protection circuit delivers a large amount of current, which further increases consumption.

SUMMARY OF THE INVENTION

It is therefore an object of the present invention to provide a novel type of driver circuit for a PMOS power transistor which overcomes the above technical problem.

The solution of the present invention is based on varying the current levels of the generators used for turning on/off the PMOS switch to suit the states of the protection circuit, the power transistor gate, and the transistor itself. The above problem is thus solved by a driver circuit for P-channel MOS switches including a power transistor having a control terminal and first and second conduction terminals, a controlled current generator connected to the control terminal for turning on the power transistor, and a control circuit for controlling the turning on of the controlled current generator. The driver circuit may further include a protection circuit connected to the control terminal and providing a control signal to the control circuit, and a second current generator connected to the control terminal and driven by the control circuit to control the turning off of the power transistor.

The second current generator may be connected in series with a controlled switch, and the control circuit may control the controlled switch. The second current generator may include at least one pair of generators connected in parallel together and individually connected in series with a corresponding controlled switch. One of the at least one pair of generators may be smaller than the other of the pair of generators. Furthermore, each of the at least one pair of generators may be connected in series to a corresponding MOS transistor.

The protection circuit may include a storage element for generating the control signal at the end of an action by the protection circuit. Also, the protection circuit may include a sense resistor defining a threshold, and the control signal may be issued when the threshold is exceeded.

BRIEF DESCRIPTION OF THE DRAWINGS

The features and advantages of the protection circuit of the present invention will be apparent from the following description of an embodiment thereof, given by way of non-limitative example with reference to the accompanying drawings.

DETAILED DESCRIPTION OF THE PREFERRED EMBODIMENTS

Figure 5:
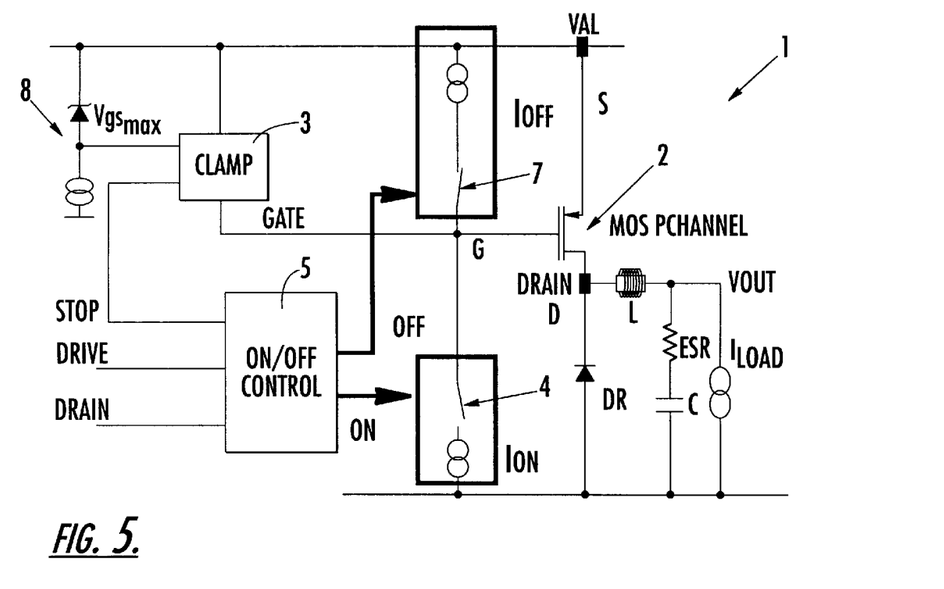
FIG. 5 is a schematic diagram of a driver circuit for a P-channel MOS transistor according to the present invention.

Referring now to FIG. 5, a driver circuit 1 for driving a P-channel MOS transistor according to the invention is generally shown in schematic form. More particularly, though not exclusively, the circuit 1 is intended for driving a PMOS power transistor 2 incorporated in a switching type of voltage regulator. The PMOS transistor 2 has a control or gate terminal G, as well as first and second conduction terminals S and D. The first or source terminal S is connected to a first supply voltage reference VAL. The second terminal D is connected to a second voltage reference GND (which may be a ground reference) through a loop-back diode DR.

The terminal D is further connected to an electric load Load via an inductor L. A capacitor, along with its equivalent series resistance (ESR) is placed in parallel with the load Load. The gate terminal G of the PMOS transistor 2 receives a drive voltage Vgs through a protection circuit 3 schematically represented in the form of a block CLAMP connected to the supply reference VAL. A bias circuit portion 8 enables the protection circuit 3 to be supplied.

The driver circuit 1 of the invention advantageously includes a first turn-on current generator ION connected between the second voltage reference GND and the gate G of the power transistor 2. Connected in series to the first generator ION is a controlled switch 4 which is controlled by a signal ON from a control circuit, which will be described further below. The switch 4 is normally open. A second, turn-off current generator IOFF is connected between the first supply voltage reference VAL and the gate of the power transistor 2. The second generator IOFF is connected in series with a switch 7 which is controlled by a signal OFF from the aforementioned control circuit. The switch 7 is normally closed.

Also provided is a logic control circuit 5 into which two discrete signals DRIVE and DRAIN are input. The logic control circuit 5 has a pair of outputs ON and OFF for driving the current generators ION and IOFF, respectively. A third input of the logic control circuit 5 is connected to an output of the protection circuit 3 to receive a signal STOP therefrom indicative of the end of the protection circuit action, as well as a related request to have the power transistor 2 turned off.

Figure 6:
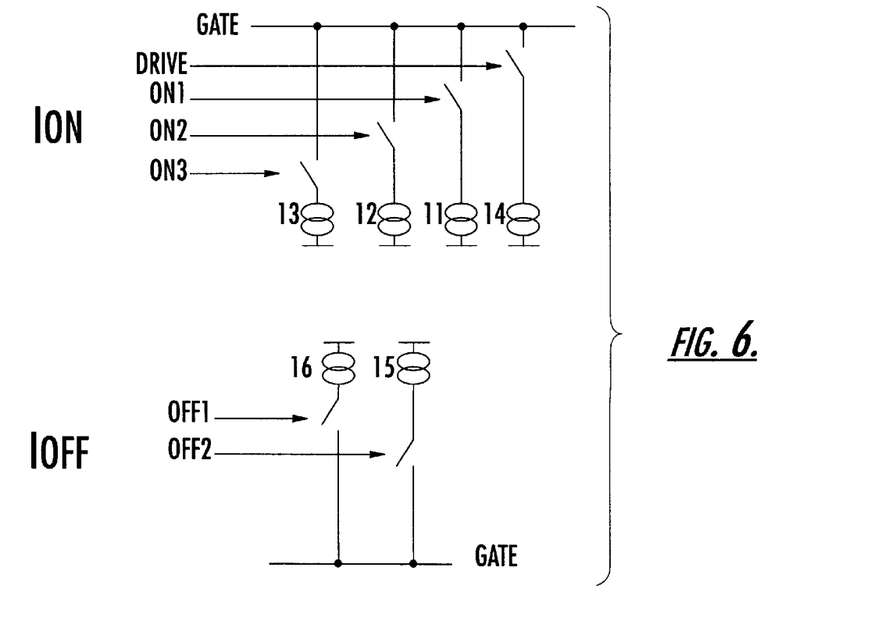
FIGS. 6A and 6B are schematic diagrams showing detailed views of the driver circuit according to the invention.
Figure 7:
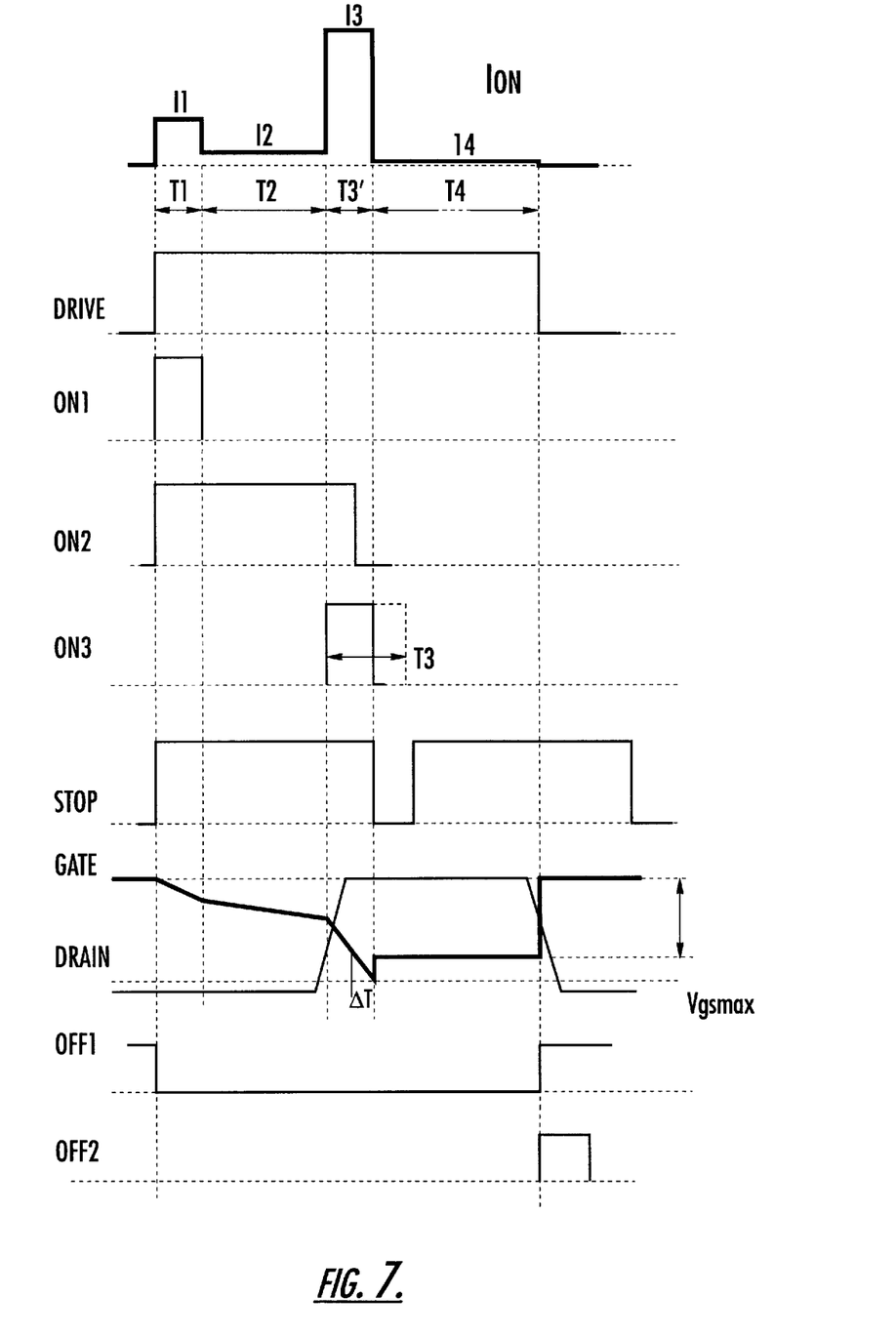
FIG. 7 is a graph vs. time of a series of current signal waveforms appearing in the circuit of FIG. 5.

The current from the generator ION is given the waveform shown in FIG. 7 by the logic control circuit 5. The construction of the generator ION is illustrated in greater detail in the schematic diagram of FIG. 6A. The generator ION includes a set of at least four switches placed in parallel, each being connected in series with a respective one of the current generators.

The sequence of the signals ON1, ON2, ON3 is unchanged from prior art driver circuits, thus ensuring proper management of the loop back diode recovery time. Contrary to prior art circuits, however, the levels of the currents I1 and I2 in the driver circuit of the present invention change over the time intervals T1 and T2 of the turn-on transient. During that time period, the logic control circuit 5 would disconnect the generator IOFF, thereby avoiding problems from cross-conduction (signals OFF1 and OFF2 low). Thus, lower values of the currents I1 and I2 can suffice to provide the same turn-on rate for a given power switch.

Possible variations in the duration of the signal ON3 (time interval T3) are accommodated by arranging for the current from the generator ION to be reduced at once (from about ten mA to a few tens of $\mu$A) through the signal STOP upon operation of the protection circuit 3. To minimize the trigger time $\Delta T$ of the protection circuit 3, and thus minimize the consumption and strain on the gate terminal which affect known solutions, the signal STOP is set to cross the zero one ΔT ahead of the gate reaching the threshold Vgsmax. The information about the issuing of the signal STOP and the related operation of the protection circuit 3 should be stored in order to prevent possible oscillations from causing noise problems and raising consumption. For this purpose, a storage element 6 is incorporated into the protection circuit 3, as described hereinafter.

Turning off is quite straightforward and only requires that a current level IOFF be provided as needed for a fast turn-off edge and to prevent cross-conduction, again in order to keep consumption low. For this purpose, the generator IOFF is formed by parallel generators I5 and I6, as shown in FIG. 6B.

Figure 8:
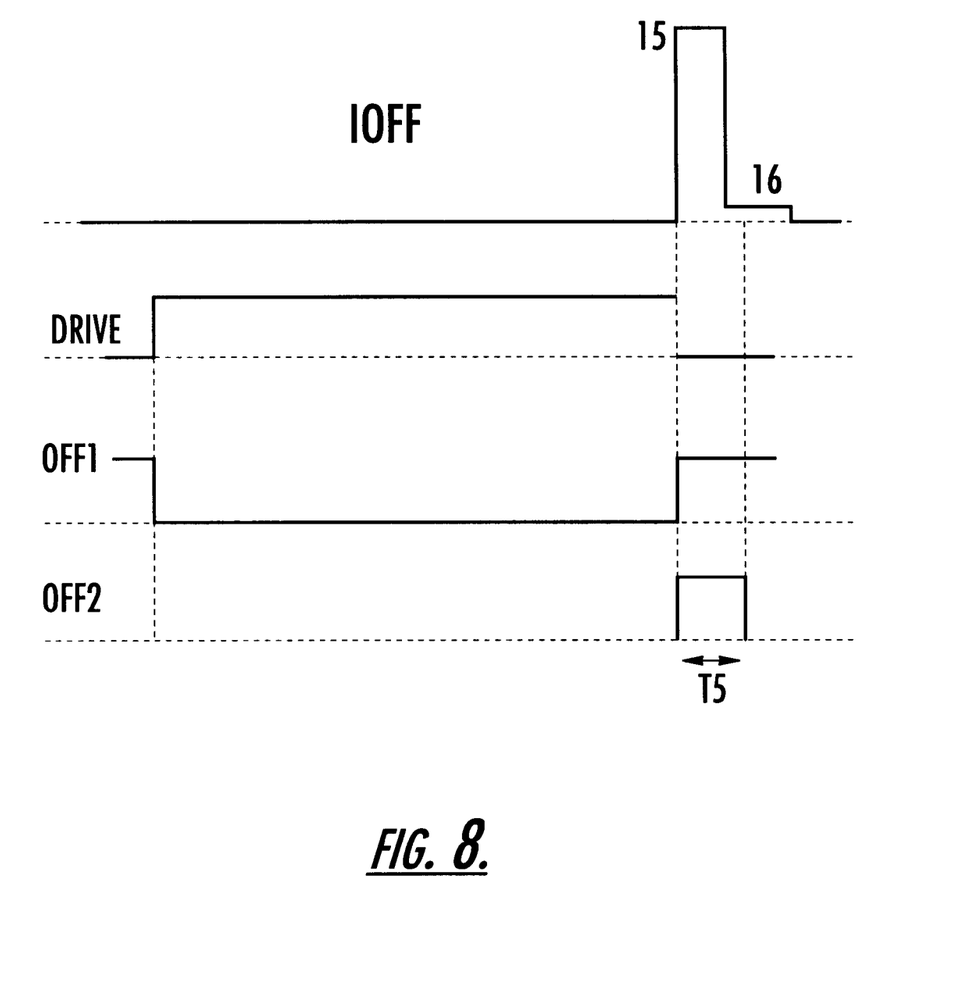
FIG. 8 is a graph vs. time of a series of current signal waveforms appearing in a particular portion of the circuit shown in FIG. 6B.

Referring now to FIG. 8, as the turn-off signal DRIVE goes low the signal OFF1 is generated to turn off the power transistor 2 by a large current supplied by the generators I5 and I6. This current has a duration of one time interval T5 and is sufficient to provide the fast turn-off rate sought. Thereafter, only the generator I6 will be held on, which is much smaller than the generator I5. In this way, cross-conduction at the next turn-on caused by the signals ON arriving before the signals OFF go to zero may be prevented. The duration of the time interval T4 is dependent on the signal DRIVE. Should the next turn-on edge arrive before the end of the time interval T4 (as a high duty cycle could allow), the signal OFF2 is immediately brought to zero.

The circuit construction is rather complicated, but for the purpose of this specification, only the various functional blocks implementing the inventive principle need to be discussed. In this regard, the logic control circuit 5 is operative to generate the signals ON and OFF with the timing relationships shown in FIG. 7. The interior construction of the logic control circuit 5 is not the subject of the present invention.

The first current generator ION includes a set of switches X4, X5, X6 and X7, which may be MOS transistors, for example, which are driven by respective signals ON1, ON2, ON3 and DRIVE, timed as shown in FIG. 7. The source terminals of the transistors X4, X5 and X6 are connected to respective current generators I1, I2 and I4. The drain current of the transistor X7 represents a generator I4. The transistor X7 has its voltage threshold Vgs as the leading edge of the signal ON3. The second current generator IOFF includes P-channel MOS transistors M5 and M6 having respective drain currents I5 and I6 that correspond to the generators described in relation to FIG. 6B.

These generators are turned on/off by switches X2 and X3, which are driven by the logic signals OFF1 and OFF2, as shown in FIG. 7. The protection circuit 3 includes a sensing and clamping portion, and a latch 6 adapted to generate the signal STOP. More particularly, a reference voltage Vgsmax is obtained at a node A through a Zener diode D4 and a generator Ib4. A set of bipolar transistors Q1, Q2, Q3 and Q4 provide the clamping function, with the transistors Q3 and Q4 being connected together in a Darlington configuration and arranged to allow connection of the sense resistor Rsense to the collector of the transistor Q4.

Figure 9:
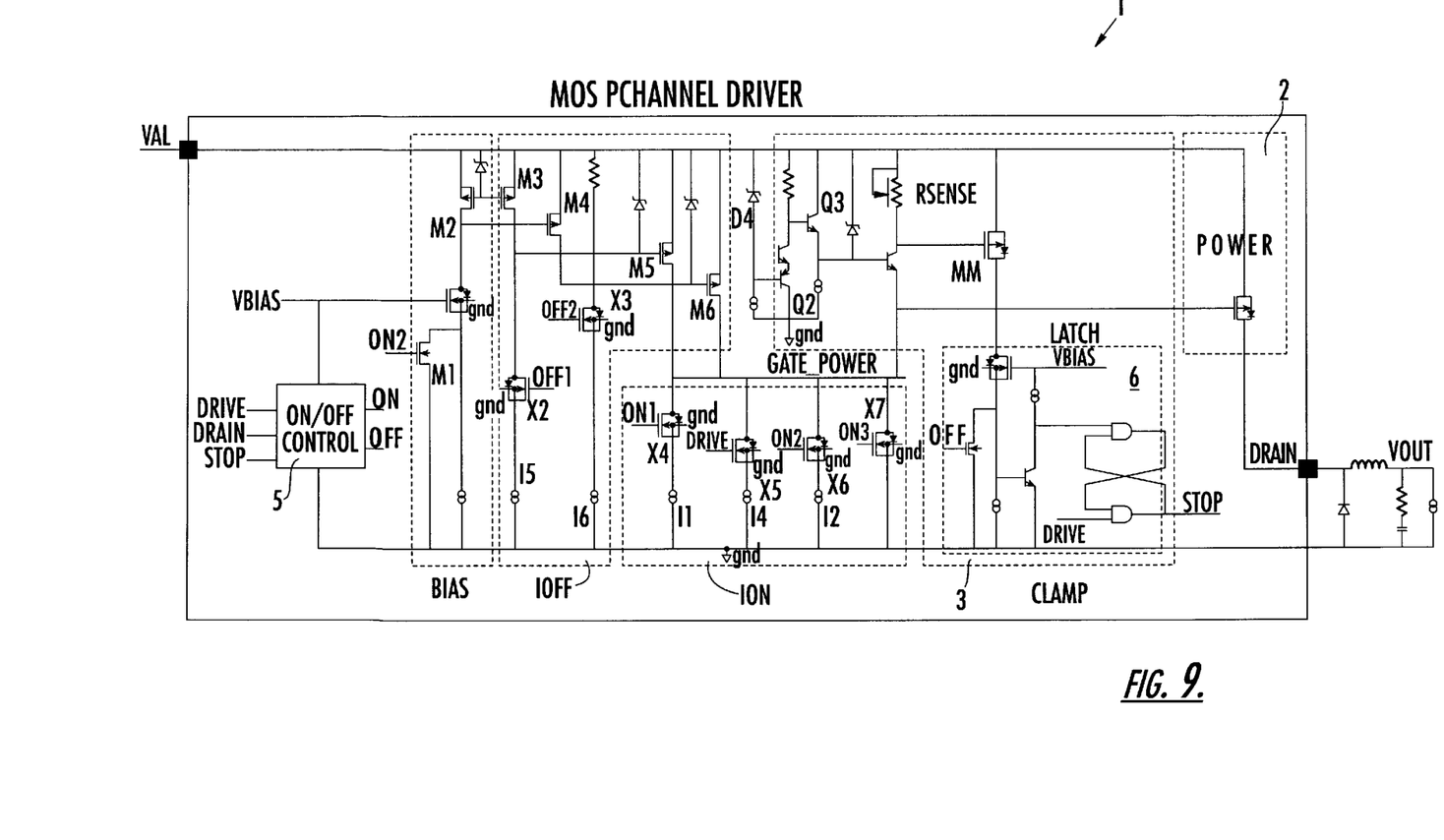
FIG. 9 is a more detailed schematic diagram of the driver circuit according to the present invention.

The resistor Rsense sets the threshold of operation for the signal STOP, which allows any variations of the time interval T3 and ΔT of the protection circuit 3 to be recovered. Moreover, the signal STOP output from the latch 6 is set at a logic high by the signals DRIVE and OFF1 (the latter representing the negated signal DRIVE) and reset to zero as a PMOS transistor MM carries a drain current Is larger than that supplied by a generator Ib3. This would occur upon the voltage drop across the resistor Rsense being large enough to ensure, for the transistor MM, a sufficient Vgs to present the current is on its drain. Thus, by suitably selecting the resistance of Rsense, the time delays can be reduced to a minimum and consumption optimized.

The bias block BIAS is operative to supply the whole driver circuit 1 with the necessary voltages and currents for it to operate as expected. A transistor M1, driven by the signal ON2, strengthens circuit construction from the standpoint of resistance to noise. In fact, upon turn-on, as the gate G of the power transistor 2 is quickly pulled down, the generators might enter the "on" state for a short time (thus increasing consumption by cross-conduction) even with the generators I5, I6 in the off state. This is due to the effect of a parasitic capacitance which would always be present between the drains and gates of the transistors M5 and M6. The action of the transistor M1 causes the current on the diode M2 to increase and hold the transistors M5 and M6 "off" throughout the time interval T2 (via the transistors M3, M4).

The driver circuit of this invention solves the above problem and affords a number of other advantages, foremost among which is that the same rates of commutation can be provided at a reduced overall consumption from the circuit. In addition, the protection for the gate terminal of the power transistor can be more effective and poses less reliability problems. The consumption of the driver circuit, moreover, is unrelated to the switch size. Barring the gate charge required to turn on the power transistor, the consumption from the stage is, in fact, under constant control by the logic control circuit 5, preventing non-essential consumption.

That which is claimed is:

1. A driver circuit for a P-channel MOS power transistor having a control terminal and first and second conduction terminals, the driver circuit comprising:
 a controlled current generator connected to the control terminal for turning on said power transistor;
 a control circuit for controlling the turning on of said controlled current generator;
 a protection circuit for detecting a driving voltage across the control terminal and the first conduction terminal higher than a threshold voltage and providing a control signal to said control circuit responsive thereto; and
 a second current generator connected to the control terminal and driven by said control circuit to control the turning off of said power transistor.

2. The circuit of claim 1 further comprising a controlled switch connected in series with said second current generator and controlled by said controller.

3. The circuit of claim 1 wherein said second current generator comprises at least one pair of current generators connected in parallel together and individually connected in series with a corresponding controlled switch.

4. The circuit of claim 3 wherein one of said at least one pair of current generators is smaller than the other one of said pair of current generators.

5. The circuit of claim 3 wherein each of said at least one pair of current generators is connected in series with a corresponding MOS transistor.

6. The circuit of claim 1 wherein said protection circuit comprises a storage element for generating the control signal at the end of an action by said protection circuit.

7. The circuit of claim 1 wherein said protection circuit comprises a sense resistor defining the threshold voltage.

8. A switching-type voltage regulator comprising:
 a P-channel MOS power transistor having a control terminal and first and second conduction terminals; and at least one driving circuit for driving said power transistor and comprising
  a controlled current generator connected to the control terminal for turning on said power transistor,
  a control circuit for controlling the turning on of said controlled current generator,
  a protection circuit for detecting a driving voltage across the control terminal and the first conduction terminal higher than a threshold voltage and providing a control signal to said control circuit responsive thereto, and
  a second current generator connected to the control terminal of said power transistor and driven by said control circuit to control the turning off of said power transistor.

9. The circuit of claim 8 further comprising a controlled switch connected in series with said second current generator and controlled by said controller.

10. The voltage regulator of claim 8 wherein said second current generator comprises at least one pair of current generators connected in parallel together and individually connected in series with a corresponding controlled switch.

11. The voltage regulator of claim 10 wherein one of said at least one pair of current generators is smaller than the other one of said pair of current generators.

12. The voltage regulator of claim 10 wherein each of said at least one pair of current generators is connected in series with a corresponding MOS transistor.

13. The voltage regulator of claim 8 wherein said protection circuit comprises a storage element for generating the control signal at the end of an action by said protection circuit.

14. The voltage regulator of claim 8 wherein said protection circuit comprises a sense resistor defining the threshold voltage.

15. The voltage regulator of claim 8 wherein the voltage regulator is implemented using BCDV technology.

16. A method for driving a P-channel MOS power transistor having a control terminal and first and second conduction terminals, the method comprising:
  generating a first current for turning on the power transistor;
  generating a second current for turning off the power transistor;
  detecting a driving voltage across the control terminal and the first conduction terminal higher than a threshold voltage;
  generating a control signal responsive to detecting the driving signal being higher than the threshold voltage; and
  controlling generation of the first and second currents responsive to the control signal using a controller.

17. The method of claim 16 wherein generating the second current comprises generating the second current using a current generator connected in series with a switch and controlling the switch using the controller.

18. The method of claim 16 wherein generating the second current comprises generating the second current using at least one pair of current generators connected in parallel together and individually in series with a corresponding switch and controlling the switches using the controller.

19. The method of claim 18 wherein one of the at least one pair of current generators is smaller than the other one of the pair of current generators.

20. The method of claim 18 wherein each of the switches comprises a MOS transistor.

21. The method of claim 16 wherein generating the control signal comprises generating the control signal using a storage element.

22. The method of claim 16 further comprising defining the threshold voltage using a sense resistor.

* * * * *